United States Patent [19]
Adkins et al.

[11] Patent Number: 5,739,464
[45] Date of Patent: Apr. 14, 1998

[54] PADMOUNTED TRANSFORMER ENCLOSURE AND LATCH

[75] Inventors: Herbert S. Adkins, Vienna; Dennis J. Struemph, St. Thomas; Richard A. Wolfgang, Jefferson City, all of Mo.

[73] Assignee: ABB Power T&D Company Inc., Raleigh, N.C.

[21] Appl. No.: 725,773

[22] Filed: Oct. 4, 1996

[51] Int. Cl.⁶ ................................................ H05K 5/03
[52] U.S. Cl. ................ 174/50; 220/327; 336/90; 292/251
[58] Field of Search ................ 174/50, 66; 220/3.8, 220/3.92, 3.94, 4.02, 210, 327, 328, 241; 336/65, 66, 67, 90, 105; 312/111, 222; 292/251, 256.71, 283, 284

[56] References Cited

U.S. PATENT DOCUMENTS

| | | | |
|---|---|---|---|
| Re. 31,134 | 1/1983 | Lux, Jr. ................................ | 336/65 |
| 1,167,322 | 1/1916 | Troyer et al. ........................ | 220/324 |
| 2,326,003 | 8/1943 | Bailey et al. ........................ | 220/57 |
| 3,070,691 | 12/1962 | Relich .................................. | 240/147 |
| 3,315,023 | 4/1967 | Davis .................................... | 174/50 X |
| 3,784,727 | 1/1974 | Haubein .............................. | 174/50 X |
| 3,801,727 | 4/1974 | Wilkinson et al. .................. | 174/50 |
| 3,878,600 | 4/1975 | Gilbert ................................ | 220/327 X |
| 3,944,718 | 3/1976 | Bright .................................. | 174/50 |
| 4,078,843 | 3/1978 | Bozich ................................ | 292/57 |
| 4,329,835 | 5/1982 | Pucher ................................ | 56/320 |
| 4,388,991 | 6/1983 | Price .................................... | 206/53 |
| 4,533,786 | 8/1985 | Borgmeyer et al. ................ | 174/50 |
| 5,189,257 | 2/1993 | Borgmeyer et al. ................ | 174/50 |
| 5,409,308 | 4/1995 | Reuter et al. ........................ | 312/319.4 |
| 5,493,090 | 2/1996 | Vestner et al. ...................... | 218/7 |

FOREIGN PATENT DOCUMENTS 992190   5/1965   United Kingdom ............. 220/3.92 X

*Primary Examiner*—Kristine L. Kincaid
*Assistant Examiner*—Dean A. Reichard
*Attorney, Agent, or Firm*—Woodcock Washburn Kurtz Mackiewicz & Norris LLP

[57] ABSTRACT

An enclosure and latching structure for the cable compartment of a tank for a padmounted distribution transformer. The enclosure is of non-conductive fire resistant material. A curved latch arm of non-conductive material is pivotally connected to support structure mounted on the front tank panel of the transformer above the midpoint thereof. The enclosure is shaped to conceal the cable compartment of the tank and is open at the back for engaging the periphery of the tank panel. The enclosure has an opening in the front adjacent the top thereof through which extends a locking device secured to the enclosure for mating with locking structure carried at the free end of the latch arm. The locking device in the opening in the front of the enclosure engages the locking structure at an elevation on the enclosure higher than the pivoted end of the latch arm whereby when the locking device and locking structure are tightened, a compression and moment loading is generated which combine to create a force on the enclosure to hold the open back of the enclosure tightly against the periphery of the tank panel.

13 Claims, 4 Drawing Sheets

PADMOUNTED TRANSFORMER ENCLOSURE AND LATCH

BACKGROUND OF THE INVENTION

1. Field of the Invention

This invention relates in general to electrical transformer enclosures, and more specifically to a cable compartment cover and associated latching mechanism for single phase padmounted distribution transformers.

2. Description of the Prior Art

Single phase padmounted transformers are installed in residential areas, and it is desirable that they be aesthetically designed and have no sharp corners or edges as well as having tamper-resistant interfaces between the cable compartment cover and the transformer tank. An example of padmounted transformer enclosures is disclosed in U.S. Pat. No. 4,533,786. In that patent there is disclosed a metal "clam shell" type cover with a large steel cover hinged at the top and a sill approximately 6" high to which the cover is bolted. A variety of baffling was built into the cover and/or sill to meet the ANSI C.57.12.28 tamper resistance requirements. One of the problems with metal transformer covers or enclosures is that they are subject to significant corrosion problems. Such problems are encountered in coastal environment and even in non-coastal regions corrosion problems can be experienced due to fertilizers, road salt, irrigation systems, lawn equipment, etc. While stainless steel cabinets will solve the corrosion problem, such cabinets are expensive.

It would be desirable to have a cable compartment enclosure that is non-metallic, non-conductive and thus not subject to corrosion problems. It would also be desirable to have an enclosure that is of one-piece construction and does not require a cover hinged at the top and a sill. It would also be desirable to have a strong but lightweight cover to minimize the lifting force required. The lifting force required for a hinged metal cover is in the order of 40 lbs. It would further be desirable to provide an improved latching structure for the enclosure for the cable compartment which not only tightly secures the enclosure to the tank of the transformer but provides center point latching so that the enclosure will vent in the event of a pressure build-up due to an electrical failure.

SUMMARY OF THE INVENTION

The present invention is a new and improved enclosure and latching structure for the cable compartment of a tank for a padmounted distribution transformer. The transformer tank has a panel for the attachment of electrical cable and a curved latch arm is pivotally connected at one end to support structure mounted on the tank panel above the midpoint thereof. Locking structure is provided on the other end of the latch arm and an enclosure of non-conductive material open at the bottom is arranged to conceal the cable compartment of the tank. The enclosure is open at the back for engaging the periphery of the tank panel. The enclosure is provided with a central opening in the front adjacent the top thereof. A second locking structure is carried by the enclosure and extends through the opening in the front of the enclosure. The two locking structures are constructed and arranged to be removably connected with each other. The second locking structure engages the first locking structure at an elevation on the enclosure higher than the pivoted end of the latch arm whereby when the locking structures are tightened a compression and moment loading is generated which combine to create a force on the enclosure to hold the open back of the enclosure tightly against the periphery of the tank panel. The curvature of the latch arm is convexo-concave and the latch arm is preferably molded of non-conductive material. In a preferred form of the inventions the enclosure is molded from a fire resistant composite material comprising a thermoset resin impregnated with glass fibers. The periphery of the open back of the enclosure is provided with groove structure for receiving tongue structure on the periphery of the tank panel to provide and maintain tamper-resistant interfaces between the enclosure and the transformer tank. A spring means is mounted on the support structure beneath the latch arm for biasing the latch arm in an upward direction. The top wall of the enclosure is provided with guide structure on the inner surface thereof and the latch arm is provided with a projection for riding in the guide structure under the bias of the spring means to guide the first locking structure for connection to the second locking structure. The front wall of the enclosure is provided with handle structure located beneath the opening of the latch structure for removing the enclosure from the transformer tank to provide access to the cable compartment of the transformer when the locking structures are disconnected from each other.

BRIEF DESCRIPTION OF THE DRAWINGS

For a more detailed disclosure of the invention and for further objects and advantages thereof, reference is to be had to the following description taken in conjunction with the accompanying drawings, in which.

DESCRIPTION OF THE PREFERRED EMBODIMENT

Figure 1:
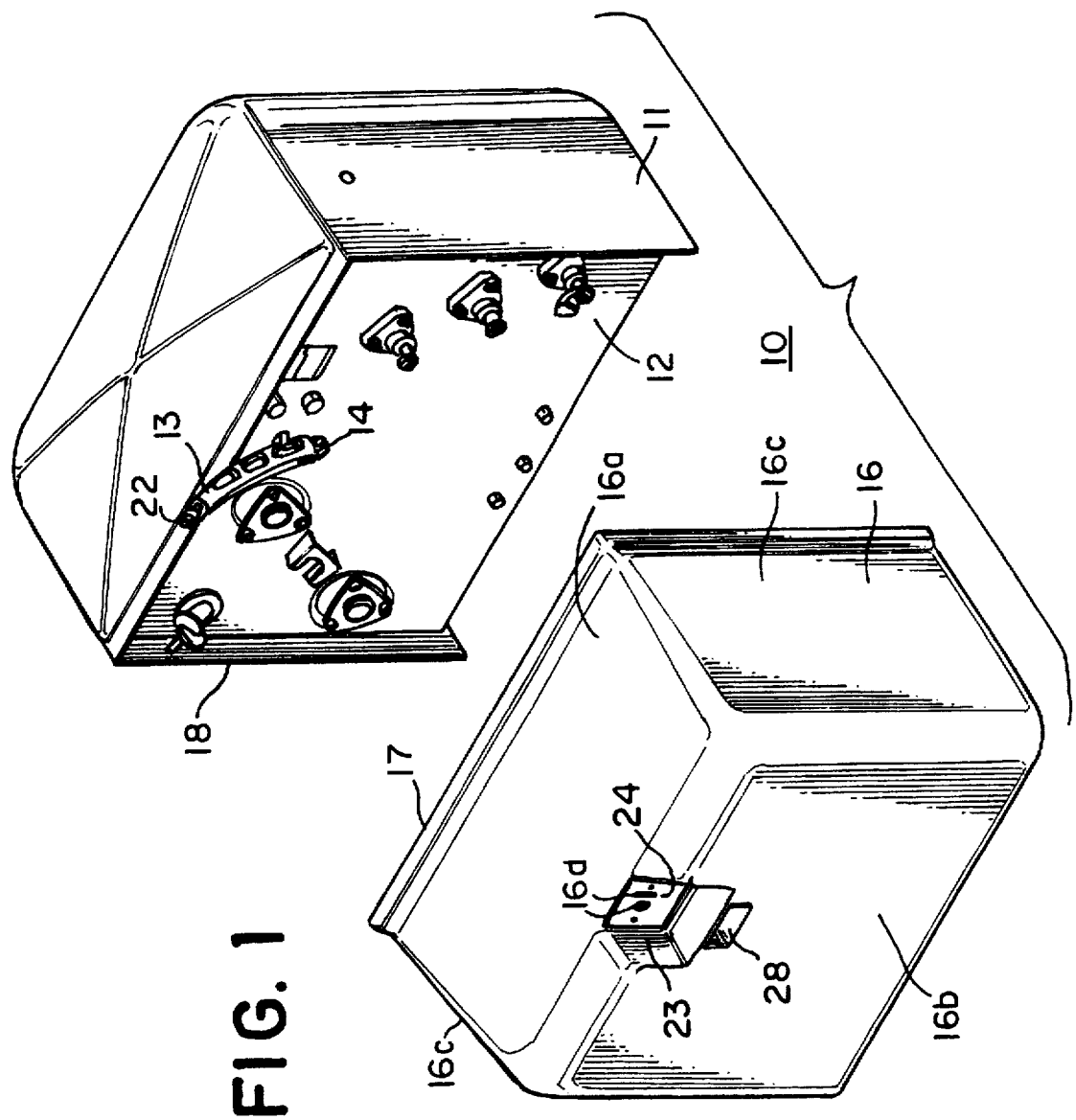
FIG. 1 is a perspective view of the present invention showing the transformer tank with the enclosure in open position.
Figure 2:
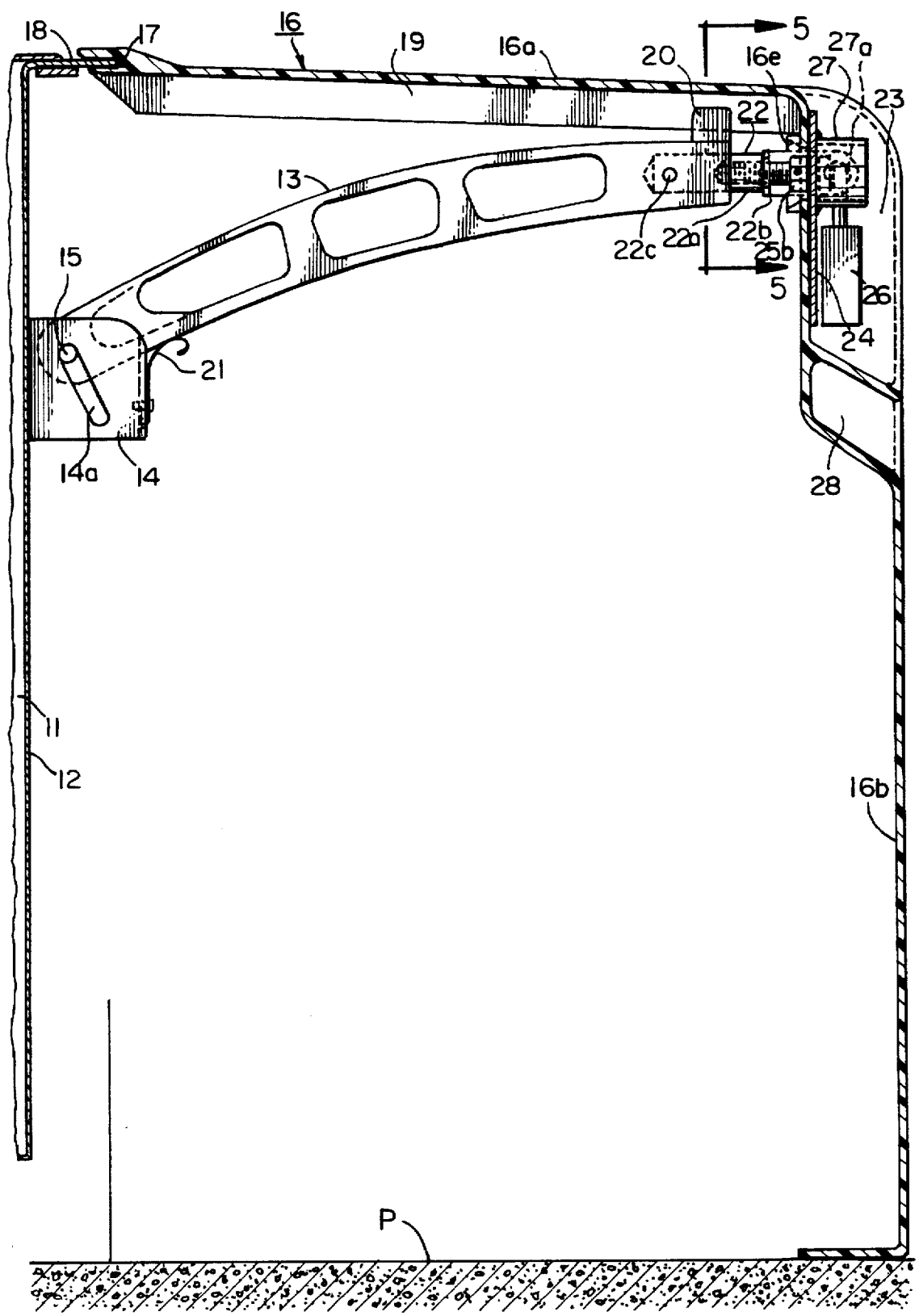
FIG. 2 is a vertical sectional view of the present invention showing the enclosure closed and latched.
Figure 3:
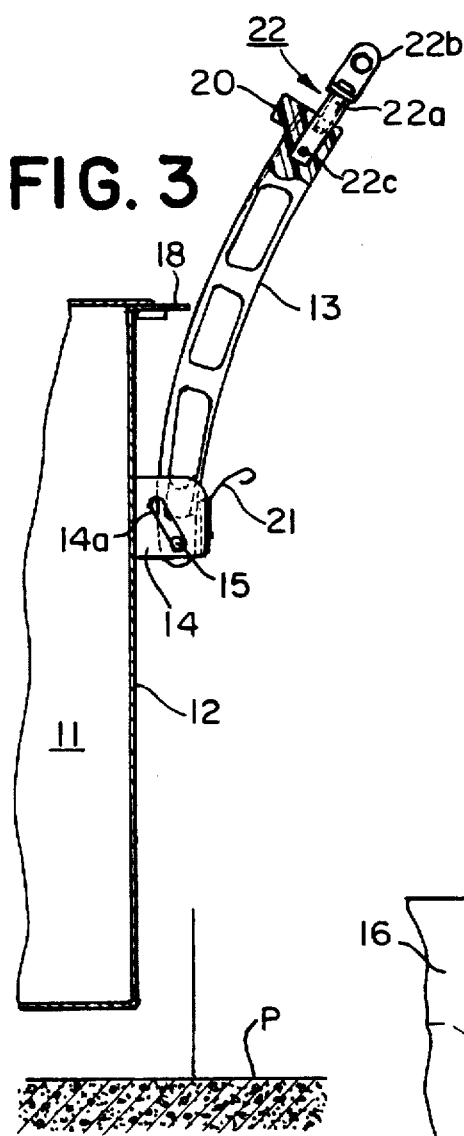
FIG. 3 is a partial vertical sectional view showing the enclosure removed and the latch arm in raised position for installation or servicing.
Figure 4:
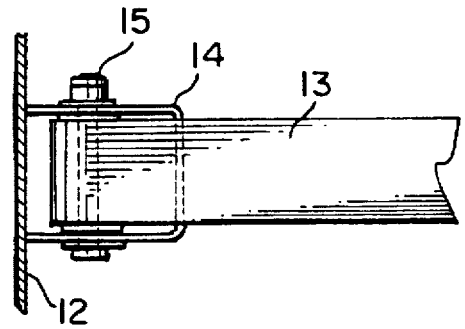
FIG. 4 is a partial fractional plan view showing the slotted channel latch arm support.

Referring to FIGS. 1 and 2 there is illustrated a padmounted distribution transformer 10 having an improved enclosure and latching structure for the cable compartment of the transformer tank. The transformer tank 11 is provided with a panel 12 for the attachment of electrical cable, not shown. As shown in FIGS. 1–3, a curved latch arm 13, preferably of non-conductive material, is pivotally carried at one end by a support structure 14 mounted on the tank panel 12 above the midpoint thereof. The other end of the latch arm 13 is adapted to engage a lock bolt as later to be described. As may be seen in FIGS. 2–4 the support structure 14 is a slotted bracket mounted on the tank panel 12. The bracket 14 is provided with slots 14a for receiving a cross pin 15 carried by one end of the latch arm 13. The cross pin 15 pivotally connects one end of the latch arm 13 to the support structure 14 and the cross pin 15 is movable within the slots 14a to permit the latch arm 13 to rotate from the locking position shown in FIG. 2 to a vertical position for servicing as shown in FIG. 3. As may be seen in FIGS. 1–3 the curvature of the latch arm 13 is convexo-concave. The curvature of the latch arm 13 allows for clearance of electrical cables to be connected to the tank panel 12 in the cable compartment. The curvature of the arm 13 also allows the latching point 15 to be low enough on the tank panel 12, which point is below the lock bolt, to produce a combined tension and moment loading which secures the enclosure 16 to the tank 11 as hereinafter to be more fully described.

Figure 5:
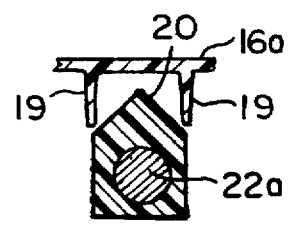
FIG. 5 is a sectional view along lines 5—5 in FIG. 2 showing the latch arm projection and associated guide ribs.

The enclosure 16 is made of non-conductive material open at the bottom and arranged to conceal the cable compartment of the tank 11. The enclosure 16 preferably is molded in one-piece construction from a non-conductive, flame resistant, composite material including a thermoset resin impregnated with glass fibers. Other suitable non-conductive composite materials having similar physical characteristics including lightweight and high strength may also be used. It will be seen that the enclosure 16 is open at the back for engaging the periphery of the tank panel 12. As may be seen in FIG. 2 the periphery of the open back of the enclosure 16 is provided with a groove 17 for receiving the tongue structure 18 on the periphery of the tank panel 12. This tongue and groove type interface secures the enclosure 16 around the tank edge assuring tamper resistance and eliminates the need for extra tamper resistant baffling. The enclosure 16 includes a top wall 16a, a front wall 16b and a pair of sidewalls 16c. The enclosure 16 is open at the bottom for resting on a pad P which may be made of cement as shown in FIG. 2. The top wall 16a of the enclosure 16 is provided with guide structure in the form of spaced guide ribs 19, FIG. 5, which are adapted to receive a projection 20 carried at the free end of the latch arm 13. A latch arm balance spring 21 is mounted on the support 14 and is adapted to apply a spring bias to the underside of the latch arm 13. As may be seen in FIG. 2, the spring 21 applies an upward bias to arm 13 sufficient to maintain the projection 20 on the arm 13 in the groove structure 19 on the top wall of the enclosure 16 during installation of the enclosure 16. When the enclosure is removed, the latch arm 13 may be rotated about its pivot 15 in an upward direction to assume the substantially vertical position illustrated in FIG. 3 for installation or servicing of the transformer cables.

As shown in FIGS. 2 and 3 the outer or free end of the latch arm 13 has secured thereto locking structure 22 including a lock nut 22a and a lock tab 22b. The enclosure 16 is provided with an opening 16d, FIG. 1, in the top front center of the front wall 16b adjacent the top wall 16a thereof for receiving the locking structure 22. The groove structure 19 and the projection 20 on the latch arm 13 cooperate to guide the locking structure 22 to the wall opening 16d. A lock pocket 23 is molded in the top front center of the front wall 16b of the enclosure 16 around the opening 16d. Mounted within the lock pocket 23 and over the opening 16d is a latch plate 24, FIGS. 1, 2, 7 and 8, which is secured to the enclosure 16 by a plurality of bolts 24a, FIG. 6. The latch plate 24 has two openings therein, one for receiving a lock bolt 25 carried by the enclosure 16 to mate with the lock nut 22a and the other for receiving the lock tab 22b of the locking structure 22. The lock nut 22a is in the form of an internally threaded tubular member or bushing that is pinned at 22c to the outer end of the latch arm 13. The outer end of the tubular member 22a has secured thereto the lock tab 22b which is in the form of a right angle member, the free end of which has an opening therethrough for receiving the pivoted hasp of a padlock 26. As shown in FIG. 1 the opening 16d preferably is made in two areas for alignment with the two openings in latch plate 24 one for receiving the lock bolt 25 carried by the enclosure 16 and the other for receiving the lock tab 22b of the locking structure 22, FIG. 6. The area of opening 16d through which the lock tab 22b is adapted to extend is in the form of a slot in the front wall 16b and surrounded on the inner surface thereof by annular guide structure 16e, FIG. 8. The guide structure 16e preferably is molded on the inner surface of the front wall 16b with a tapered or funnel shaped surface extending around the slot to aid in guiding the lock tab 22b through the opening 16d and into the slot in the latch plate 24.

Figure 7:
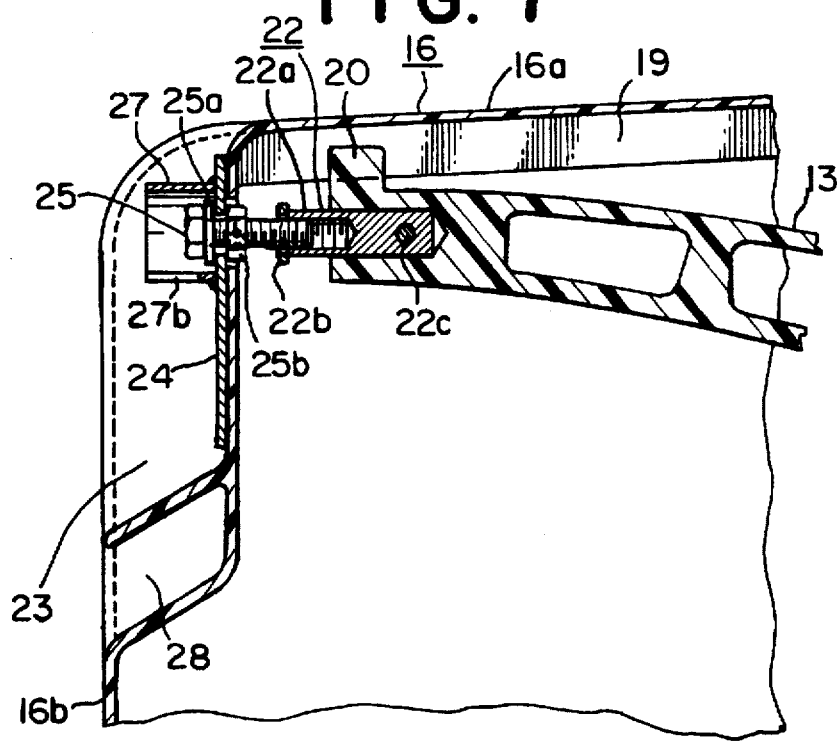
FIG. 7 is a sectional view taken along the lines 7—7 in FIG. 6.
Figure 8:
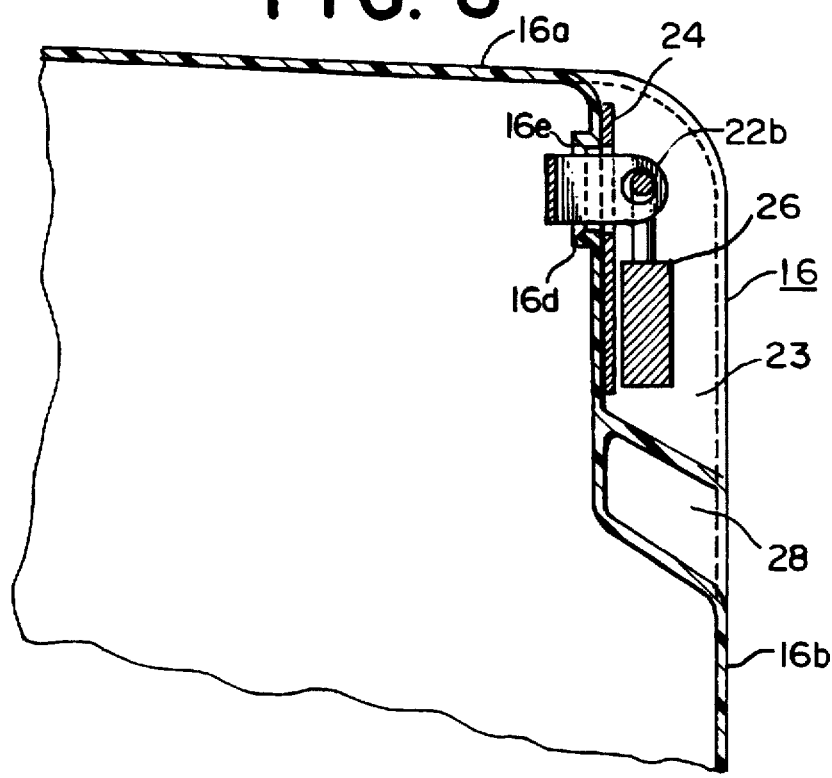
FIG. 8 is sectional view taken along the lines 8—8 in FIG. 6.

When installing the enclosure 16, the guide ribs 19 on the enclosure 16 and the projection 20 on the latch arm 13 act to provide a self centering action along with the annular guide 16e and guide the lock tab 22b through the opening 16d and into the slot in the latch plate 24 which automatically aligns the lock nut 22a carried on the end of arm 13 with the lock bolt 25. As pointed out above, the lock bolt 25 is carried by the latch plate 24 and the enclosure 16 and remains with the enclosure when the enclosure 16 is removed from the transformer tank 11. The lock bolt 25 has been omitted from FIG. 1 for clarity. The lock bolt 25 has a substantial threaded length and is mounted for free rotation in the opening in the latch plate 24, for example, by a pair of retainers on either side of the latch plate. An example of this construction is best seen in FIG. 7 where a washer 25a is positioned between the head of lock bolt 25 and the latch plate 24 and a nut 25b is pinned to the lock bolt 25 on the other side of the latch plate 24. The head of the lock bolt 25 is accessible from the exterior of the latch plate 24 while the threaded end of the lock bolt 25 extends through the latch plate 24 so that it can be threadedly received by the lock nut 22a on the arm 13.

As may be seen in FIG. 2 the lock bolt 25 extending through the opening in the front wall of the enclosure 16 engages the locking structure 22 at an elevation on the enclosure 16 higher than the pivoted end 15 of the latch arm 13 whereby when the lock nut 22a of the locking structure 22 and the lock bolt 25 are tightened a compression and moment loading is generated which combine to create a force on the enclosure 16 including the bottom corners thereof to hold the open back of the enclosure tightly against the periphery of the tank panel 12. This secures the tongue 18 on the tank panel within the groove 17 on the enclosure 16. Because of the built in flexibility of the enclosure 16 in conjunction with the locking structure 22 on the arm 13 the hasp of the padlock 26 cannot be installed in the lock tab 22b until the lock bolt 25 is tightened sufficiently in the lock nut 22a to secure the enclosure 16 and thus move the head of the lock bolt 25 beyond the slot in the lock tab 22b.

Figure 6:
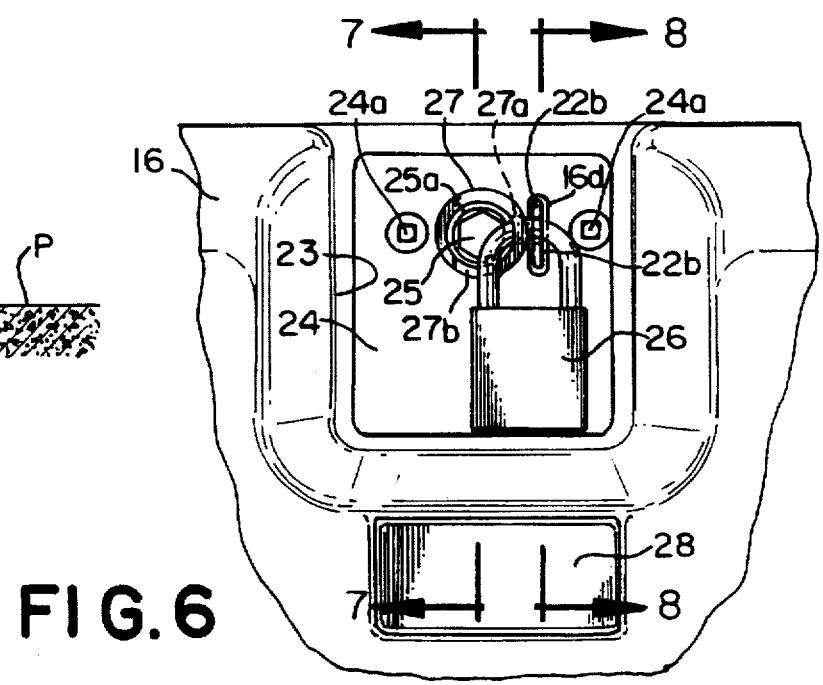
FIG. 6 is a partial front elevation view showing the latch plate, lock bolt, lock tab and padlock assembly and molded-in lift panel handle shown in FIG. 2.

To make the lock bolt 25 tamper resistant, a recessed non-rotating cup 27, FIG. 6, is welded to the outside of the latch plate 24 and surrounds the head of the lock bolt 25. The cup 27 is in accordance with ANSI American Standard C.57.12.28. The cup 27 has an appropriate opening 27a and slot 27b in the sidewall thereof to permit the hasp of the padlock 26 to extend therethrough during installation in the lock tab 22b.

To enhance removal, the threaded end of the lock bolt 25 is sufficiently long to force the latch arm 13 against the bracket 14 on the front panel 11 and force the inside nut 25b on the bolt 25 against the inside of the latch plate 24 and front wall 16b while turning out the bolt 25 in the unlatching process thus pushing the enclosure 16 off of the tank 11. This action will aid in removal of the enclosure 16 in cases where the tank/enclosure interface 17–18 binds or the enclosure movement is impeded by dirt, snow, ice, etc. A convenient molded-in handle 28 is provided under the lock pocket 23 to improve the ease of handling the enclosure 16 and minimize the bending required when installing or removing the enclosure 16. Due to the center point latching, the enclosure will vent in the event of a pressure build-up due to an electrical failure.

As pointed out above the curved latch arm 13 preferably is made of nonconductive material similar to the material from which the enclosure 16 is made. In a preferred form of the invention the curved latch arm 13 was molded in one-piece construction from a non-conductive, flame resistant, composite material including a thermoset resin impregnated with glass fibers. Other suitable non-conductive composite materials having similar physical characteristics including lightweight and high strength may also be used. While the locking structure 22 has been shown as fixed to the end of the arm 13 by a pin 22c, FIG. 2, it is to be understood that the locking structure may be fixed to the end of the arm 13 in other suitable ways. For example, the locking structure 22 may be molded onto the end of arm 13 during the molding of arm 13. While the latch arm 13 is preferably made of non-conductive material, it is to be understood that the latch arm 13 could be made of metal. If the arm is made of metal, it would preferably be covered with insulation material.

While there has been described a preferred embodiment of the invention, it will be understood that further modifications may be made without departing from the spirit and scope of the invention as set forth in the appended claims.

What is claimed is:

1. An enclosure and latching structure for a cable compartment of a tank for a padmounted distribution transformer comprising:

a transformer tank having a panel for the attachment of electrical cable, a curved latch arm, support structure mounted on said tank panel above the midpoint thereof, means for pivotally connecting one end of said latch arm to said support structure, first locking structure on the other end of said latch arm, an enclosure of non-conductive material arranged to conceal the cable compartment of said tank, said enclosure being open at a back side thereof for engaging a periphery of said tank panel, said enclosure having a central opening in a front wall adjacent a top thereof, and second locking structure carried by said enclosure and extending through said opening in said front of said enclosure, said first and second locking structures being constructed and arranged to be removably connected with each other, said second locking structure engaging said first locking structure on said other end of said latch arm at an elevation on said enclosure higher than said pivoted one end of said latch arm whereby when said first and second locking structures are tightened a compression and moment loading are generated which combine to create a force on said enclosure to hold said open back of said enclosure tightly against the periphery of said tank panel.

2. An enclosure and latching structure for the cable compartment of a tank for a padmounted distribution transformer according to claim 1 wherein said curvature of said latch arm is convexo-concave and said latch arm is molded of non-conductive material.

3. An enclosure and latching structure for the cable compartment of a tank for a padmounted distribution transformer according to claim 1 wherein said support structure comprises a bracket having a plurality of slots mounted on said tank panel and said means for pivotally connecting said one end of said latch arm to said support structure comprises a cross pin carried by said one end of said latch arm and positioned within the slots of said bracket to permit said latch arm to rotate and be held in a vertical position.

4. An enclosure and latching structure for the cable compartment of a tank for a padmounted distribution transformer according to claim 1 wherein said enclosure is molded from a fire resistant composite material comprising a thermoset resin impregnated with glass fibers.

5. An enclosure and latching structure for the cable compartment of a tank for a padmounted distribution transformer according to claim 1 wherein a periphery of the open back of said enclosure is provided with groove structure for receiving tongue structure on the periphery of said tank panel.

6. An enclosure and latching structure for the cable compartment of a tank for a padmounted distribution transformer according to claim 1 wherein said enclosure comprises said top wall and said front wall and a pair of sidewalls molded in one piece, and said front wall of said enclosure having handle structure located beneath said opening for removing said enclosure from said transformer tank to provide access to the cable compartment of the transformer.

7. An enclosure and latching structure for the cable compartment of a tank for a padmounted distribution transformer according to claim 6 including spring means mounted on said support structure beneath said latch arm for biasing said latch arm in an upward direction, said top wall of said enclosure having a guide on an inner surface thereof, said latch arm having a projection for riding in said guide on said enclosure under the bias of said spring means to assist in alignment of said first locking structure on said latch arm with said opening in said front wall of said enclosure when said enclosure is being installed on said transformer tank.

8. An enclosure and latching structure for the cable compartment of a tank for a padmounted distribution transformer according to claim 6 wherein said opening for receiving said locking structures and said handle structure are molded in said front wall of said enclosure.

9. An enclosure and latching structure for the cable compartment of a tank for a padmounted distribution transformer according to claim 8 including a latch plate mounted over the opening in the front wall of said enclosure, said second locking structure being carried by said latch plate and said latch plate having an opening therein for receiving said first locking structure on said latch arm.

10. An enclosure and latching structure for the cable compartment of a tank for a padmounted distribution transformer according to claim 9 wherein said first locking structure comprises lock nut means and a lock tab, said second locking structure comprises lock bolt means, and said opening in said front wall of said enclosure is behind said latch plate and includes self-centering means for guiding said lock tab into said opening in said latch plate which automatically aligns said lock nut means with said lock bolt means.

11. An enclosure and latching structure for the cable compartment of a tank for a padmounted distribution transformer according to claim 10 wherein said lock tab includes a slot for receiving a padlock, said slot being located so as to prevent installation of the padlock until the lock bolt means is tightened sufficiently to secure said enclosure to said tank.

12. An enclosure and latching structure for the cable compartment of a tank for a padmounted distribution transformer according to claim 11 wherein said lock bolt means is so constructed and arranged to push said enclosure away from said tank when said lock bolt means is loosened to enhance removal of said enclosure from said tank.

13. An enclosure and latching structure for a cable compartment of a tank for a padmounted distribution transformer comprising:

- a transformer tank having a panel for the attachment of an electrical cable,
- a curved latch arm of non-conductive material,
- support structure mounted on said tank panel above the midpoint thereof,
- means for pivotally connecting one end of said latch arm to said support structure,
- first locking structure on the other end of said latch arm,
- spring means mounted on said support structure beneath said latch arm for biasing said latch arm in an upward direction,
- a one-piece enclosure of non-conductive, flame resistant material for enclosing the cable compartment of said tank, said enclosure having a top wall and front wall and a pair of sidewalls and being open at a back side thereof for engaging a periphery of said tank panel and being open at the bottom for resting on a pad, said enclosure having an opening in the front wall adjacent the top wall thereof for receiving said first locking structure,
- second locking structure carried by said enclosure and extending through said opening in said front wall of said enclosure, the top wall of said enclosure having guide structure on an inner surface thereof, said latch arm having a projection for riding in said guide structure on said enclosure under the bias of said spring means to guide said first locking structure for threaded connection to said second locking structure, said second locking structure engaging said first locking structure at an elevation on said enclosure higher than said pivoted one end of said latch arm whereby when said first and second locking structures are tightened a compression and moment loading are generated which combine to create a force on said enclosure to hold said open back of said enclosure tightly against the periphery of said tank panel, and
- said front wall of said enclosure having handle structure located beneath said opening for removing said enclosure from said transformer tank to provide access to the cable compartment of the transformer.

* * * * *